United States Patent
Spring et al.

(10) Patent No.: US 6,893,923 B2
(45) Date of Patent: May 17, 2005

(54) REDUCED MASK COUNT PROCESS FOR MANUFACTURE OF MOSGATED DEVICE

(75) Inventors: Kyle Spring, Temecula, CA (US); Jianjun Cao, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 7 days.

(21) Appl. No.: 10/094,835

(22) Filed: Mar. 7, 2002

(65) Prior Publication Data

US 2002/0137322 A1 Sep. 26, 2002

Related U.S. Application Data

(60) Provisional application No. 60/277,637, filed on Mar. 21, 2001.

(51) Int. Cl.$^7$ .............................................. H01L 21/336
(52) U.S. Cl. ...................... 438/270; 438/275; 438/278; 438/301
(58) Field of Search ............................... 438/585, 592, 438/199, 231, 232, 524, 526, 700, 274, 273, 546, 549, 138, 135, 268, 710, 270, 272, 278, 275, 301, 302, 259, 242, 276; 257/328, 330–340

(56) References Cited

U.S. PATENT DOCUMENTS

| | | | | |
|---|---|---|---|---|
| 4,467,450 A | * | 8/1984 | Kuo ............................ | 365/149 |
| 5,148,247 A | * | 9/1992 | Miura et al. ................. | 257/262 |
| 5,635,748 A | | 6/1997 | Nishizaka ................... | 257/390 |
| 5,776,812 A | * | 7/1998 | Takahashi et al. .......... | 438/268 |
| 5,780,324 A | * | 7/1998 | Tokura et al. ............... | 438/138 |
| 5,817,558 A | * | 10/1998 | Wu .............................. | 438/291 |
| 5,874,341 A | * | 2/1999 | Gardner et al. ............. | 438/301 |
| 5,882,966 A | * | 3/1999 | Jang ............................ | 438/234 |
| 5,929,481 A | * | 7/1999 | Hshieh et al. ............... | 257/328 |
| 5,932,909 A | * | 8/1999 | Kato et al. ................... | 257/316 |
| 5,937,297 A | | 8/1999 | Peidous ...................... | 438/270 |
| 6,087,240 A | * | 7/2000 | Gilchrist ..................... | 438/398 |
| 6,144,054 A | * | 11/2000 | Agahi et al. ................. | 257/296 |
| 6,177,336 B1 | | 1/2001 | Lin et al. ..................... | 438/592 |
| 6,248,652 B1 | * | 6/2001 | Kokubun ..................... | 438/585 |
| 6,406,956 B1 | | 6/2002 | Tsai et al. .................... | 438/201 |
| 6,406,958 B2 | * | 6/2002 | Kato et al. ................... | 438/257 |
| 6,667,227 B1 | * | 12/2003 | Liu et al. ..................... | 438/589 |
| 6,674,123 B2 | * | 1/2004 | Kim ............................. | 257/328 |
| 6,674,124 B2 | * | 1/2004 | Hshieh et al. ............... | 257/330 |
| 6,737,323 B2 | * | 5/2004 | Mo .............................. | 438/270 |
| 6,768,164 B2 | * | 7/2004 | Lin et al. ..................... | 257/321 |

FOREIGN PATENT DOCUMENTS

EP 1162665 A2 * 12/2001 ........... H01L/29/78

* cited by examiner

Primary Examiner—Laura M Schillinger
(74) Attorney, Agent, or Firm—Ostrolenk, Faber, Gerb & Soffen, LLP

(57) ABSTRACT

A process for forming a power MOSFET enables the connection a metal gate electrode to the conductive polysilicon gates in the active area without an additional mask step. In the process, a groove is formed in the field oxide during the active area mask step. Conductive polysilicon is then formed over the active area and into the groove. At least one window is formed over the groove along with the mask window for forming the channel and source implant windows, and the polysilicon is etched to the silicon surface in the active area, but a strip is left in the groove. This strip is contacted by gate metal during metal deposition. Thus, gate metal is connected to the polysilicon without an added mask step.

5 Claims, 3 Drawing Sheets

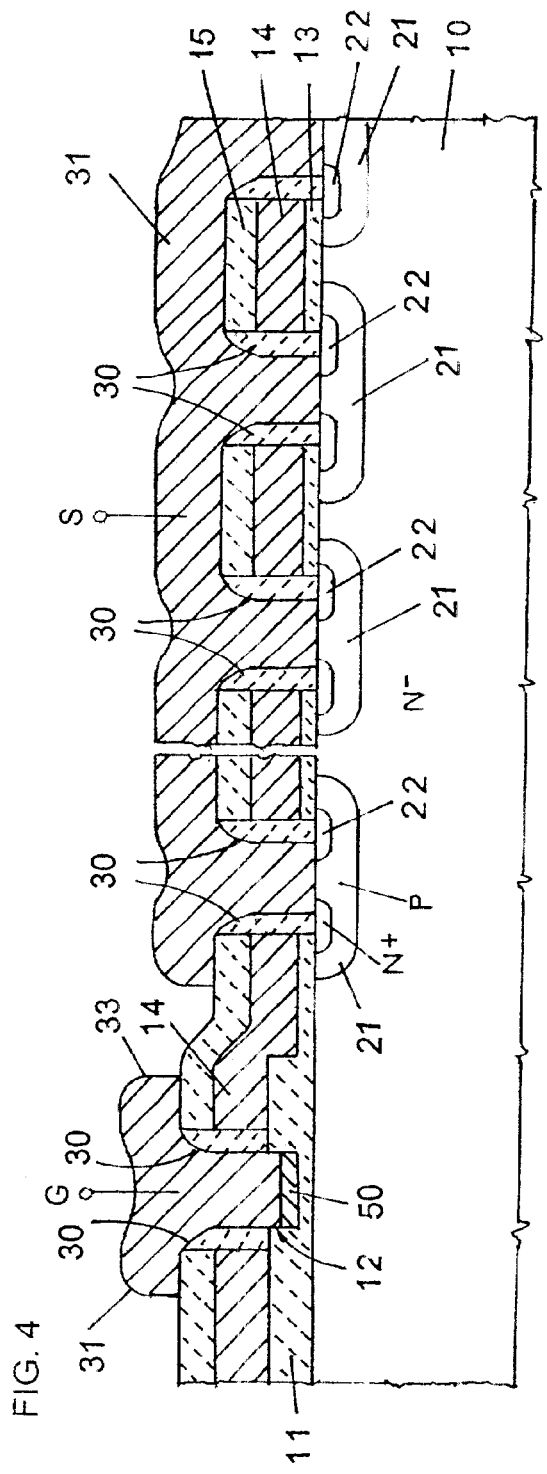
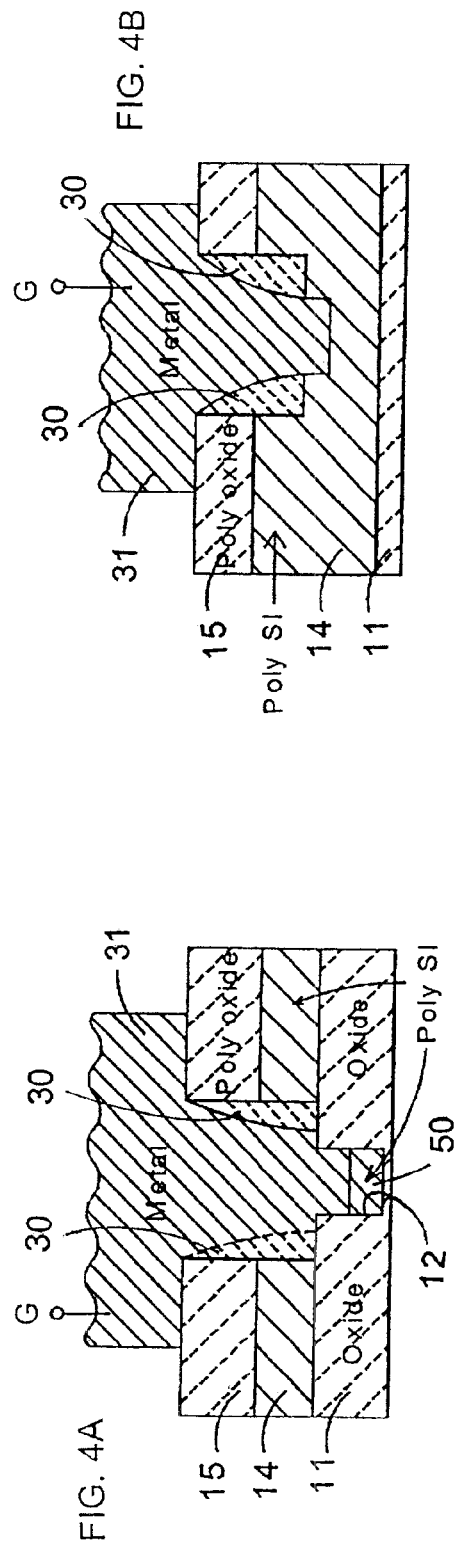
FIG. 4
FIG. 4A
FIG. 4B

REDUCED MASK COUNT PROCESS FOR MANUFACTURE OF MOSGATED DEVICE

RELATED APPLICATION

This application claims the benefit of U.S. Provisional Application No. 60/277,637, filed Mar. 21, 2001.

FIELD OF THE INVENTION

This invention relates to semiconductor device processing and more specifically relates to a novel reduced mask count process for the manufacture of a MOSgated semiconductor device and a novel resulting device structure.

BACKGROUND OF THE INVENTION

MOSgated devices, such as power MOSFETs and IGBTs are very well known, and have a gate electrode, usually made of conductive polysilicon, which must be electrically insulated from the source electrode (or emitter electrode) and yet must be electrically connected to an external metallic gate conductor or gate pad, usually of aluminum. In the self aligned contact power MOSFET, contact to the source is made in the active area, using spacer technology. However, the gate metal-to-gate polysilicon contact at the gate pad has required the use of a separate photo mask step.

It is desirable to reduce the number of photomask steps needed in a manufacturing process to reduce cost and to increase yield of devices from a wafer.

The present invention provides a novel process which eliminates the need for a separate mask for the gate polysilicon to gate metal connection in a manufacturing process.

SUMMARY OF THE INVENTION

In accordance with the invention, a groove is formed in the P+ field oxide during the active mask step in which the field oxide layer is otherwise etched to open the active area. Thus, no subsequent added mask is needed to form this groove. Thereafter, and during polysilicon deposition, the groove is filled as the polysilicon is deposited atop the field oxide.

During the polysilicon mask etch step additional windows are opened in the polysilicon layer above the groove in the oxide and in the area where the polysilicon to metal contact is to take place. Again no added mask is used and the necessary polysilicon mask is simply modified for this added window.

Next, the conventional polyoxide and polysilicon etch and insulation spacer steps are carried out, and the polysilicon remaining in the bottom of the groove is exposed.

The conductive metal contact is then deposited atop the polyoxide and it fills the window(s) previously formed and contacts the polysilicon in the groove, which is connected to the body of the polysilicon layer. Thus, the contact is made without the need for an extra mask.

BRIEF DESCRIPTION OF THE DRAWINGS

FIG. 4 shows the structure of FIG. 3 after the etch of the polyoxide and polysilicon areas exposed by windows in the photo resist; the formation of insulation spacers over the exposed edges of the polysilicon layer; and the deposition of a contact metal.

FIG. 4A shows the structure of FIG. 3B after the process steps of FIG. 4.

FIG. 4B shows the structure of FIG. 3C after the process steps of FIG. 4.

DETAILED DESCRIPTION OF THE PREFERRED EMBODIMENT

Figure 1:
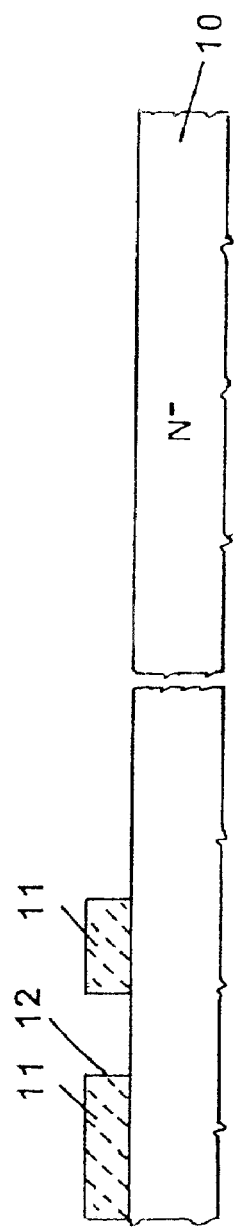
FIG. 1 shows a portion of a semiconductor die, in cross-section, with field oxide which has been patterned to expose the active area surface and a groove which can receive a contact metal contact to the polysilicon subsequently formed in the active area.

Referring first to FIG. 1, there is shown a silicon die 10 which has an N⁻ epitaxial layer grown atop an N+ substrate (not shown) of conventional structure. The invention applies equally to devices with a P type substrate. A field oxide layer 11 is conventionally deposited or otherwise formed atop substrate 10, and, in an active area mask step, the large active area 12 has field oxide removed therefrom to enable the subsequent formation of the junction pattern in the active area. In accordance with the invention, a further window or windows in the active area mask permits the formation of one or more grooves 12, which, as will be later seen, will permit the gate metal to contact the polysilicon gate in the active area without an added mask step.

Figure 2:
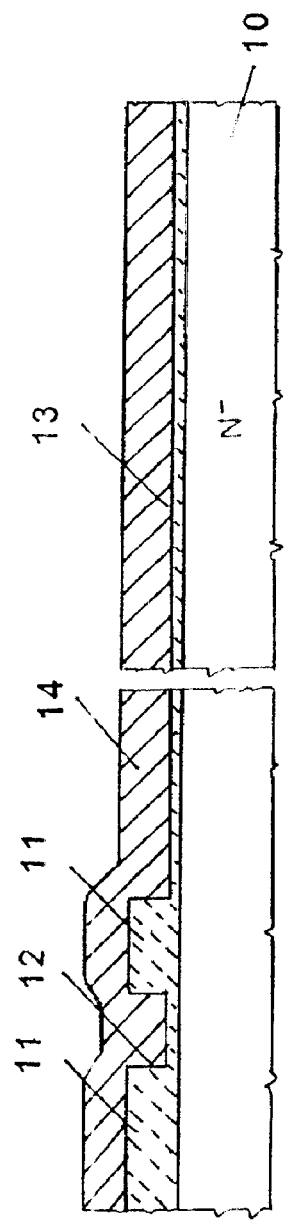
FIG. 2 shows the cross-section of FIG. 1 after the deposition of polysilicon.
Figure 3:
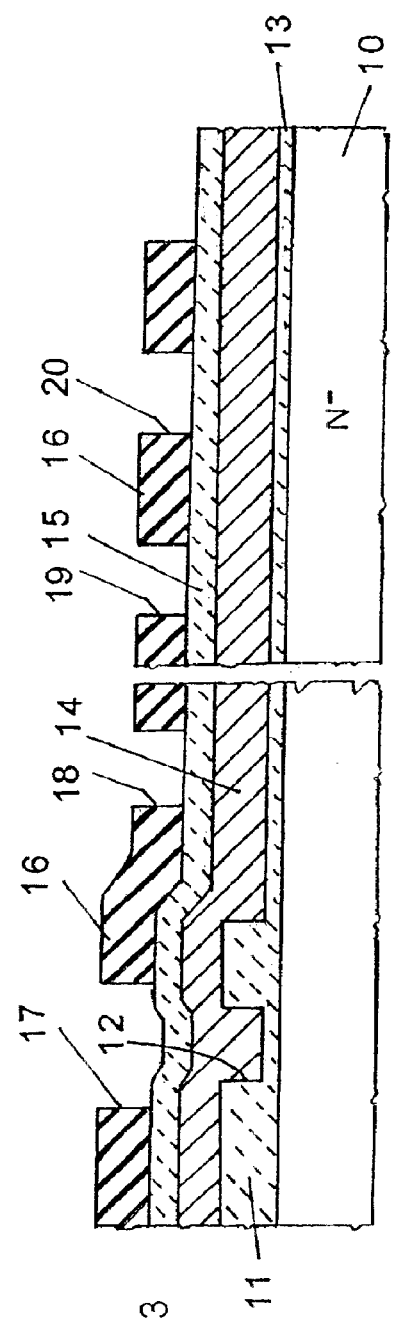
FIG. 3 shows the structure of FIG. 2 after the formation of a polyoxide layer atop the polysilicon and a photoresist layer (patterned) atop the polyoxide layer.
Figure 3A:
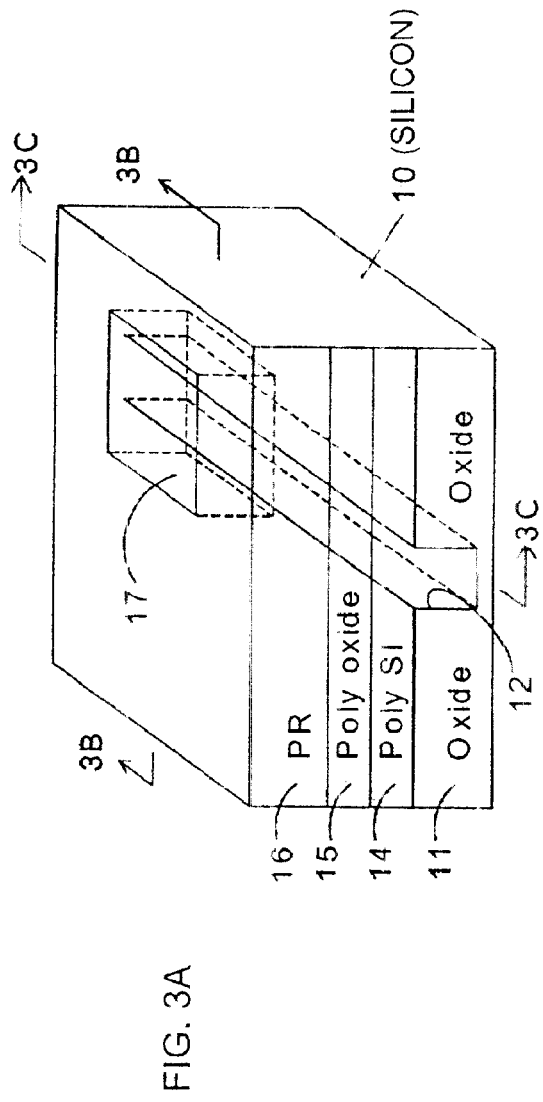
FIG. 3A is a schematic isometric view of a portion of FIG. 3 illustrating one window patterned in the photoresist atop the groove in the filed oxide.
Figure 3B:
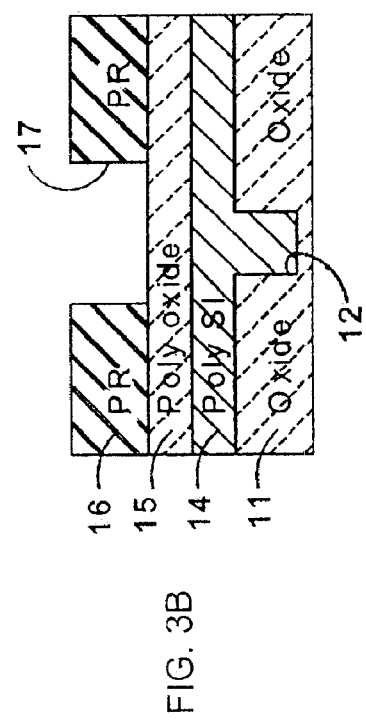
FIG. 3B is a cross section of FIG. 3A taken across section line 3b—3b in FIG. 3A.
Figure 3C:
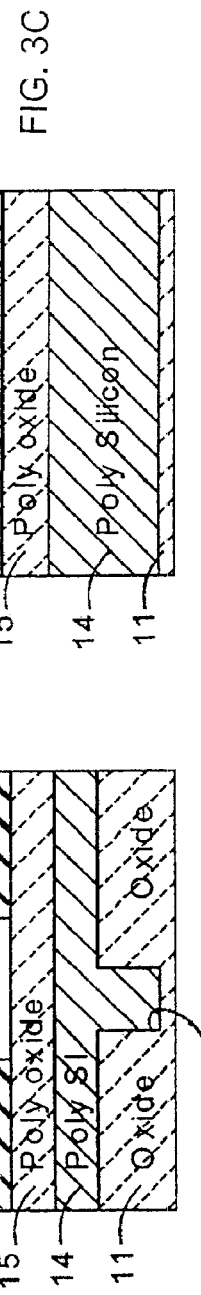
FIG. 3C is a cross-section of FIG. 3A taken across section line 3c—3c in FIG. 3A.

As next shown in FIG. 2, a gate oxide layer 13 is thermally grown atop the exposed active silicon area which was exposed in FIG. 1, and a conductive polysilicon layer 14 is formed atop gate oxide 13, as well as over the groove 12 and remaining field oxide segments 11.

Thereafter, and as shown in FIGS. 3, 3A, 3B and 3C a polyoxide layer 15 is conventionally formed atop polysilicon layer 14. A photoresist layer 16 is then formed atop polyoxide layer 15 and is a patterned in a mask step to open windows 17, 18, 19 and 20 and other similar windows. Mask windows 18, 19 and 20 are conventional implant windows used for the formation of channel diffusion regions 21 and source diffusion region 22 for a vertical conduction MOSFET. (A drain contact will be formed on the bottom of die 10.) These diffusions 21 and 22 may be cellular or in stripe form and can have any desired size, depth and topology. Mask window 17 (FIGS. 3, 3A, 3B and 3C is also formed at this same mask step, disposed over an aligned with groove 12. Any number of windows 17 can be used.

An etch process is then used to remove the portions of polyoxide layer 15, polysilicon layer 14 and gate oxide layer 13 which are exposed by windows 17 to 20. Note that a bottom line portion 50 of polysilicon layer 14 remains at the bottom of groove 12 after this etch process (FIGS. 4, 4A and 4B). Note also that no added mask step is needed to form polysilicon line 23, which is integrally connected to the polysilicon member (gate electrodes) 14.

Thereafter, a conductive contact layer 31, which may be aluminum is deposited as by sputtering, to make contact with polysilicon line 50 and the source and channel regions 22 and 21. A contact mask step then permits the removal of metal in gap 33 (FIG. 4) to separate gate metal and source metal as shown in FIG. 4. As shown in FIGS. 4, 4A and 4B, the gate metal segment is directly connected to polysilicon strip 23, and thus to polysilicon gates 14 over the invertible channel regions on the active area. Significantly, no added mask is needed with the novel process.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for connecting a metal gate contact in a MOSgated device, comprising the steps of:

forming an oxide layer on a surface of a silicon substrate, said silicon substrate having an active surface area;

after said step of forming said oxide layer, opening a groove in a portion of said oxide layer;

in a common mask step with said step of opening a groove, opening said active surface area in said oxide layer;

forming a layer of polysilicon over said oxide layer, over at least a portion of said active surface area and into said groove;

forming a polyoxide layer over an exposed surface of said layer of polysilicon;

after said step of forming a polyoxide layer, masking a portion of an exposed surface of the polyoxide layer in a common mask step providing a masked area and unmasked areas, said unmasked areas defining a plurality of openings, at least one of said plurality of openings being over a first portion of said groove and at least another of said openings being over said active surface area, wherein said masked area shields a second portion of said groove and a portion of said layer of polysilicon during a subsequent step of etching; and after said step of masking, etching the polyoxide layer and said layer of polysilicon in said unmasked areas, including a portion of said layer of polysilicon formed into said first portion of said groove, leaving a strip of polysilicon in said first portion of said groove such that said strip of polysilicon is connected to said portion of said layer of polysilicon shielded by said masked area; and forming a gate contact in a common metallization step with said formation of at least one source electrode, such that said gate contact is electrically coupled with said strip of polysilicon in said bottom of said groove, said strip of polysilicon is electrically coupled with said portion of said layer of polysilicon and said portion of said layer of polysilicon forms at least one gate electrode in said active surface area of said silicon substrate.

2. The process of claim 1, further comprising masking, implanting and diffusing channel and source impurities through said plurality of openings and into said silicon exposed after said step of etching.

3. The process of claim 1, further comprising implanting and diffusing source impurities into said active surface area exposed by said at least another of said plurality of openings.

4. A process for connecting a metal gate in a MOSgated device, comprising the steps of:

opening a groove in a portion of an oxide layer which is atop a portion of a silicon substrate, said substrate having an active area adjacent said portion of said silicon under said oxide layer;

forming a layer of polysilicon over said oxide layer into said groove and over at least a portion of said active area;

masking over said layer of polysilicon in a common mask step, said mask including unmasked areas, said unmasked areas defining a plurality of openings, at least one of said plurality of openings being over a first portion of said groove, leaving a second portion of said groove masked; and etching a portion of said layer of polysilicon under said plurality of openings, leaving a strip of polysilicon in a bottom of said first portion of said groove such that said strip is connected to said layer of polysilicon in said second portion of said groove; and depositing a metal gate contact on said strip of polysilicon in said bottom of said first portion of said groove.

5. The process of claim 4, wherein said depositing a metal gate contact is conducted without an extra mask.

* * * * *